United States Patent [19]
Cutter

[11] Patent Number: 5,845,315
[45] Date of Patent: Dec. 1, 1998

[54] METHOD AND APPARATUS FOR REDUCING THE ACCESS TIME OF A MEMORY DEVICE BY DECODING A ROW ADDRESS DURING A PRECHARGE PERIOD OF THE MEMORY DEVICE

[75] Inventor: Douglas J. Cutter, Boise, Id.

[73] Assignee: Micron Technology, Inc., Boise, Id.

[21] Appl. No.: 803,598

[22] Filed: Feb. 21, 1997

Related U.S. Application Data

[63] Continuation of Ser. No. 528,021, Sep. 14, 1995, Pat. No. 5,625,790.

[51] Int. Cl.$^6$ ..................................................... G06F 12/00
[52] U.S. Cl. ..................... 711/104; 364/DIG. 1; 365/189.05; 365/203; 365/230.06; 365/230.08; 711/100; 711/105
[58] Field of Search ..................................... 395/427, 431, 395/432; 365/203, 230.06, 230.08, 189.05; 364/DIG. 1; 711/100, 104, 105

[56] References Cited

U.S. PATENT DOCUMENTS

| | | | |
|---|---|---|---|
| 5,058,063 | 10/1991 | Wada et al. | 365/185 |
| 5,065,062 | 11/1991 | Kawabara et al. | 365/189.11 |
| 5,268,865 | 12/1993 | Takasugi et al. | 365/189.05 |
| 5,327,390 | 7/1994 | Takasugi et al. | 365/230 |
| 5,412,604 | 5/1995 | Fakuda et al. | 365/189.11 |
| 5,515,322 | 5/1996 | Kondo | 365/185.21 |
| 5,519,657 | 5/1996 | Arimoto | 365/200 |
| 5,528,552 | 6/1996 | Kamisaki | 365/238.5 |

*Primary Examiner*—Tod R. Swann
*Assistant Examiner*—Tuan V. Thai
*Attorney, Agent, or Firm*—Seed and Berry LLP

[57] ABSTRACT

A memory device includes an array of memory cells that are arranged in rows and columns. A row address latch connected to the address bus stores a row address on the address bus during a precharge period responsive to a transition of a row address strobe from an active low state to an inactive high state. A row decoder connected to the row address latch decodes the stored row address, and a redundancy checker determines if the decoded row is defective and, if so, selects a redundant row of memory cells for addressing. The row address decoder and the redundancy checker perform these respective functions during the precharge period. The memory device also includes a wordline controller that fires a wordline corresponding to the addressed row responsive to a transition of the row address strobe from its inactive high state to its active low state. Significantly, the wordline can be fired almost immediately upon the transition of the row address strobe to its active state because the row address has already been decoded and the need for redundancy checked.

49 Claims, 3 Drawing Sheets

METHOD AND APPARATUS FOR REDUCING THE ACCESS TIME OF A MEMORY DEVICE BY DECODING A ROW ADDRESS DURING A PRECHARGE PERIOD OF THE MEMORY DEVICE

CROSS-REFERENCE TO RELATED APPLICATION

This application is a continuation of U.S. patent application No. 08/528,021, filed Sep. 14, 1995, now U.S. Pat. No. 5,625,790.

TECHNICAL FIELD

The present invention relates generally to memory devices and more specifically to a memory device having a reduced data access time during a read cycle.

BACKGROUND OF THE INVENTION

Computer designers continue to search for faster memory devices that will allow them to design Easter computer systems. Typically, a computer system's operating speed depends upon the time required to transfer, i.e., read or write, data between a processor and a memory circuit or device, such as a dynamic random access memory (DRAM). Such a memory device usually includes a large number of memory cells that are arranged in rows and columns. These cells store both data for the processor to operate on and the results of such operations. Therefore, the more quickly the processor can access the data within these memory cells, the more quickly it can perform a calculation or execute a program that uses this data.

Typically, to read data from a memory device, a computer processor or other memory controller circuit generates row and column addresses on an ADDRESS bus and row and column address strobes (RAS and CAS, respectively) on respective strobe lines. In a read operation, the memory device provides to the processor data stored in memory cells from the selected row and one or more selected columns. Such a memory device can often operate in at least four read modes, namely conventional, nibble, burst and page modes.

FIG. 1 is a timing diagram showing an example of a typical conventional read cycle. A processor (not shown) or associated circuitry generates the control signals $\overline{RAS}$ and $\overline{CAS}$, and ADDRESS. (A bar over the signal name indicates that the signal is active when its logic level is low, i.e., at a logic 0.) Initially, the processor drives a row address onto the ADDRESS bus, and the memory latches the row address in response to a transition of $\overline{RAS}$ from an inactive level, here logic 1, to an active level, here logic 0. Such a transition may also be referred to as a falling edge of $\overline{RAS}$. The processor then drives a column address onto the ADDRESS bus. In response to the falling edge of $\overline{CAS}$, the memory latches the column address, and places on the DATA bus the data from the memory cell located at the intersection of the addressed column and row. The processor then transitions $\overline{CAS}$ from an active level, here logic 0, to an inactive level, here logic 1, to disable the memory from transferring data to or from the DATA bus. Such a transition may also be referred to as the rising edge of $\overline{CAS}$. At either the same time or a later time, the processor transitions $\overline{RAS}$ to an inactive logic 1 for at least a predetermined time before transitioning $\overline{RAS}$ to an active logic 0 to begin the next cycle. As shown in FIG. 1, the conventional read and write modes are typically used to address a single column in a row.

Still referring to FIG. 1, the speed at which data is available on the DATA bus after $\overline{RAS}$ and the rate that data can be read from the memory device are typically specified according to a number of time parameters, including $t_{RAC}$, $t_{RAD}$, $t_{AA}$, $t_{RCD}$, $t_{CAC}$, $t_{RAS}$, $t_{RP}$, $t_{ASR}$ and $t_{RAH}$ all of which are shown in FIG. 1. (There are a large number of other time parameters that are used to specify the performance of memory devices, but these have been omitted for purposes of clarity.) The parameter $t_{RAC}$ is the time delay from the falling edge of $\overline{RAS}$ to the availability of data on the DATA bus. However, there are several other parameters that, in combination, limit the speed at which data is available on the DATA bus after $\overline{RAS}$. For example, it can be seen from FIG. 1 that the access time after the falling edge of $\overline{RAS}$ is also equal to the sum of $t_{RAD}$ and $t_{AA}$. The parameter $t_{RAD}$ is the time delay from the falling edge of $\overline{RAS}$ to the presence of the column address on the ADDRESS bus. The parameter $t_{AA}$ is the time delay from the availability of the column address on the ADDRESS bus to the availability of data on the DATA bus. Similarly, the access time after the falling edge of $\overline{RAS}$ is also equal to the sum of $t_{RCD}$, $t_{CAC}$. The parameter $t_{RCD}$ is the time delay from the falling edge of $\overline{RAS}$ to the falling edge of $\overline{CAS}$. The parameter $t_{CAC}$ is the time delay from the falling edge of $\overline{CAS}$ to the availability of data on the DATA bus. The parameter $t_{ASR}$ is the time that a row address must be present before the falling edge of $\overline{RAS}$. Finally, the parameter $t_{RAH}$ is the minimum time that the row address must be present after the falling edge of $\overline{RAS}$.

The time parameter $t_{RAS}$ is the minimum time that $\overline{RAS}$ must be at its active low level during a read operation. The time parameter $t_{RP}$ is the minimum time that $\overline{RAS}$ must be at its inactive high level before once again transitioning to its active low level. The time parameters $t_{RAS}$ and $t_{RP}$ do not relate to the speed at which data is available on the DATA bus after the falling edge of $\overline{RAS}$. However, they do limit the rate at which data can be read from a memory device since each read cycle can be no shorter than the sum of $t_{RAS}$ and $t_{RP}$.

In the operation of a typical prior art memory device, the falling edge of $\overline{RAS}$ initiates a series of operations. First, the row address is decoded by a decoder in the memory device. The time required to decode the row address is known as $t_{DEC}$. The memory device then typically checks to determine if the addressed row is defective and, if so, selects a redundant row for use in place of the addressed row. The time required to perform this redundancy check and select a redundant row, if necessary, is known as $t_{RED}$. After the row address has been decoded and redundancy checked, the wordline for the addressed row is "fired." When the wordline is "fired," the data stored in all of the memory cells on the addressed row is made available for selection by a column address so that the data stored in only one memory cell is placed on the DATA bus at any time. Firing of the wordline involves connecting each of the memory cells (typically capacitors) to respective "digit" lines, sensing the level of those lines, and outputting logic level corresponding to the sensed level from sense amplifiers to both refresh the memory cells and make the sensed data available for selection by a column address. During the time $t_{RP}$ that $\overline{RAS}$ is inactive (known as the precharge period), the wordline begins to shut off, but is delayed by an RC time constant. After sufficient time to bring the wordline to 0 volts, the digit lines are driven to an appropriate voltage level (generally between 0 volts and $V_{cc}$) so that the contents of the respective memory cells are not disrupted and can be sensed when $\overline{RAS}$ transitions to its active low state for the next access.

The number of operations that must be carried out upon the falling edge of $\overline{RAS}$ results in relatively large minimum values of $t_{RAC}$, $t_{RAD}$, and $t_{RCD}$. A significant part of these parameters is made up of the row address decode time, $t_{DEC}$, and the redundancy check time, $t_{RED}$. As a result, the duration of $t_{RAC}$, $t_{RAD}$, and $t_{RCD}$ could be decreased significantly if some means could be devised to reduce or eliminate the effects of $t_{DEC}$ and $t_{RED}$. Although it would be desirable to minimize all of these parameters, the limiting factor in the availability of data on the data bus is typically $t_{RAC}$ since the time delay from availability of the column address on the ADDRESS bus and the time delay from the falling edge of $\overline{CAS}$ normally occurs prior to time delay from the falling edge of $\overline{RAS}$. Thus, any improvement in the access time of DRAM memory devices generally must be directed to reducing $t_{RAC}$.

Not only are the time parameters $t_{DEC}$ and $t_{RED}$ a significant part of $t_{RAC}$, $t_{RAD}$, and $t_{RCD}$, but they are also a significant part of $t_{RAS}$, the minimum time that $\overline{RAS}$ must be at its active low level during a read operation. Thus, eliminating $t_{DEC}$ and $t_{RED}$ would increase the rate at which data could be read from a memory device as well as increasing the speed at which data could be available on the DATA bus after the failing edge of $\overline{RAS}$.

The timing diagram shown in FIG. 1 shows a read cycle for a conventional mode. However, it will be understood that the above discussion of FIG. 1 also applies to other read modes, including the nibble, burst, and page modes of both the normal and extended data out (EDO) variations.

FIG. 2 illustrates the row address decoding portion of a conventional memory device, such as a DRAM 10. (It will be understood that the DRAM 10 includes much additional circuitry which has been omitted from FIG. 2 for purposes of brevity and clarity.) The DRAM 10 includes an array 12 of memory cells arranged in rows and columns which are individually selectable through respective row and column addresses. Basically, a row address selects a plurality of memory cells in a row, and a column address selects an individual memory cell in that row corresponding to the intersection of the row address and the column address. When a row of the array is "fired," the memory cells (generally capacitors) in the addressed row are connected to respective digit lines and the memory cells are sensed to determine the data in the memory array 12. One of the digit pairs is then selected responsive to a column address. The particular row that is fired by a wordline controller 14 is designated by a decoded row address from either a row address decoder 16 or a redundant row checker 18. The row address decoder 16, in turn, receives a row address on bus 20 from a row address latch 22. The row address latch 22 is connected to an ADDRESS bus 24 to receive a row address from a suitable device, such as a processor. The row address latch 22 and row address decoder 16 also receive a row address strobe signal ("$\overline{RAS}$") from the processor through a $\overline{RAS}$ buffer 26. The row address strobe from tile $\overline{RAS}$ buffer is also applied to the word line controller 14 through a delay circuit 28.

In operation, the row address strobe, $\overline{RAS}$, transitions from inactive high to active low to start the processing of a row address. Upon this falling edge of $\overline{RAS}$, the row address on the ADDRESS bus 24 is latched into the row address latch 22. The row address latch 22 then presents the row address to the row address decoder 16 through the bus 20. The row address decoder 16 then decodes the row address and applies an appropriate indication of the addressed row to the wordline controller 14 via line 32 and to the redundant row checker 18 via line 34. The time required to perform this decode function is $t_{DEC}$.

Conventional memory devices such as DRAMs, typically include redundant or extra rows of memory cells that are to be used only in the event that other rows of memory cells are defective. Thus, if one or more rows of memory cells are defective, the memory device need not be discarded since redundant rows can be used in place of the defective rows. Memory devices incorporating this feature include a redundant row checker 18 as shown in FIG. 3. The redundant row checker receives the decoded row address from the row decoder 16 on line 34 and determines whether the decoded row corresponds to a row that has been flagged as being defective. If so, the redundant row checker 18 outputs a redundant row to the wordline controller 14 on line 38 to cause the wordline controller 14 to fire the row of memory cells corresponding to the redundant row instead of the previous row determined from the decoded row address. The time required for the redundant row checker 18 to perform this function is $t_{RED}$.

It will be apparent that the wordline controller 14 cannot fire the row of memory cells for the addressed row until after the row address decoder 16 and the redundant row checker 18 have performed their respective functions. Thus, the wordline controller 14 must delay firing the addressed rows until a delay period at least equal to the sum of $t_{DEC}$ and $t_{RED}$ after $\overline{RAS}$ transitions to its active state. The delay circuit 28 is used to couple $\overline{RAS}$ to the wordline controller 14 to provide this delay. Thus, the delay circuit 28 applies to the wordline controller 14 an inactive to active transition of $\overline{RAS}$ after the actual transition of $\overline{RAS}$ delayed by the sum of $t_{DEC}+t_{RED}$.

The need to use the delay circuit 28 significantly increases the delay in firing the wordline after the transition of $\overline{RAS}$. If this delay circuit 28 could be eliminated, then the addressed row could be fired significantly sooner, thereby improving the speed at which data could be accessed in memory devices. However, as explained above, it is apparently not possible to omit the delay circuit 28 since the wordline 14 cannot be fired before the row address decoder 16 and redundant row checker 18 have performed their respective functions.

Other approaches to decreasing DRAM access time have involved changes in the architecture or manufacturing processes of DRAM circuits, using shorter wordlines, or interleaving banks of memory so that different banks of memory are alternately accessed. Each of these approaches exhibit disadvantages which limit their usefulness. For example, architectural improvements generally increase the required area of the semiconductor chip and/or increase the complexity of the DRAM circuit.

The faster speeds of newer processors has heightened the need for memory devices that can be accessed faster. However, the disadvantages of conventional approaches have significantly limited their use. There is therefore a need for a method and apparatus for reducing the access time of memory devices without greatly changing memory device architecture and/or complexity, or significantly altering the operation of computer systems and other devices using such memory devices.

SUMMARY OF THE INVENTION

In accordance with one aspect of the present invention, a memory device is configured so that it decodes a row address on the ADDRESS bus during the precharge period of the memory device. As a result, the memory device can promptly fire a wordline corresponding to the decoded row address upon the transition of a row address strobe to its active state. In the event that the memory device includes circuitry for checking for the need to use a redundant row of memory cells, the memory device is preferably configured to also perform this redundancy checking function during the precharge period of the memory device.

The memory device preferably includes an array of memory cells that are arranged in rows and columns. A row address decoder coupled to the ADDRESS bus decodes a row address on the ADDRESS bus responsive to a transition of a row address strobe from an active to an inactive state. A wordline control circuit fires a row of the memory cells corresponding to the decoded row address responsive to a transition of the row address strobe from its inactive state to its active state. As a result, the wordline control can fire the row of memory cells relatively soon after the transition of the row address strobe to the active state without waiting to decode the row address. The memory device also preferably includes a redundant row checker coupled to the row decoder for determining if the decoded row is defective. If the decoded row is found to be defective, the redundant row checker selects a redundant row of the memory array in place of the addressed row prior to the transition of the row address strobe from its inactive state to its active state. The memory device may also include a row address latch positioned between the ADDRESS bus and the address decoder. The row address latch stores a row address on the ADDRESS bus responsive to the transition of the row address strobe from its active state to its inactive state. The row address latch then supplies the latched row address to the row decoder for decoding. The memory device may be used in a variety of applications, including a computer system having a processor connected to the memory device by a data bus, an ADDRESS bus, and a row address strobe line.

DETAILED DESCRIPTION OF THE INVENTION

Figure 3:
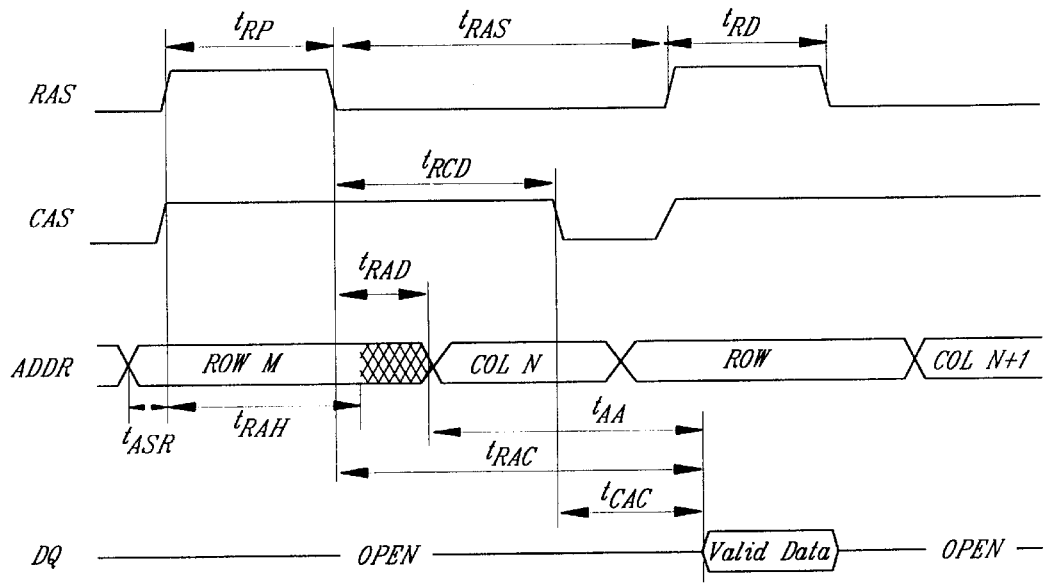
FIG. 3 is a timing diagram of a read cycle according to the present invention.

FIG. 3 is a timing diagram of a read cycle according to the present invention. Unlike the known conventional read cycle of FIG. 1 in which the row address is latched on the falling edge of $\overline{RAS}$, the row address is placed on the ADDRESS bus prior to the rising edge of the previous memory access cycle, and it is then latched in the memory device by the rising edge of $\overline{RAS}$. The memory device then decodes the row address and checks for the need to use a redundant row during the precharge period $t_{RP}$ when $\overline{RAS}$ is at its inactive high state. As a result, the duration of $t_{RAC}$ is reduced by the sum of the durations of $t_{DEC}$ and $t_{RED}$ as can be seen by comparing FIGS. 1 and 3. Similarly, the durations of $t_{RAD}$ and $t_{RCD}$ are also reduced by the durations of $t_{DEC}$ and $t_{RED}$ since the decoding and redundancy checking that normally occurs during $t_{RAD}$ and $t_{RCD}$ are accomplished during the precharge period, $t_{PR}$. After the falling edge of $\overline{RAS}$, the read cycle proceeds in a normal manner, as explained below. As shown in FIG. 3, the row address hold parameter $\overline{RAH}$ is now defined as the minimum time that the row address must be present from the rising edge of $\overline{RAS}$, However, the time that the row address must be present after the falling edge of $\overline{RAS}$ (i.e., the traditional definition of $t_{RAH}$) is significantly shorter in FIG. 3 as compared to FIG. 1.

Figure 2:
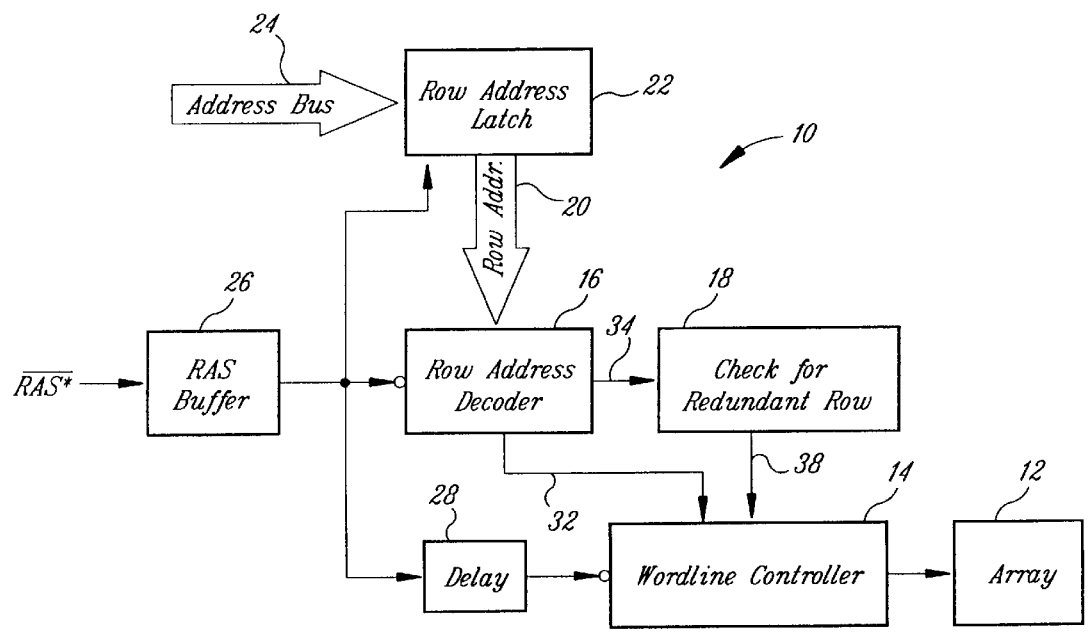
FIG. 2 is a block diagram of pertinent portions of a prior art memory device.

In a conventional read mode, as shown in FIG. 2, the processor drives a column address onto the ADDRESS bus a delay of $t_{RAD}$ after the falling edge of $\overline{RAS}$, although the column address can be placed on the ADDRESS bus before or after the falling edge of $\overline{RAS}$ since the row address need not be on the ADDRESS bus at the falling edge of $\overline{RAS}$ as in prior art memory devices. In response to the falling edge of $\overline{RAS}$, the wordline is almost immediately fired, thereby making available the data in the row for selection by a column address. Significantly, the firing of the wordline need not be delayed while the row address is being decoded and checked for the need to use a redundant row is occurring since these functions were already completed prior to the falling edge of $\overline{RAS}$.

After a delay of $T_{RCD}$ from the falling edge of $\overline{RAS}$, the processor transitions $\overline{RAS}$ to its active low state, thereby causing the memory device to latch the column address into the memory device. After a delay of $t_{CAC}$ from the falling edge of $\overline{CAS}$ and $T_{AA}$ from the column address being placed on the ADDRESS bus, the memory device places on the DATA bus the data from the memory cell located at the intersection of the addressed column and row. The processor then transitions $\overline{CAS}$ from an active level, here logic 0, to an inactive level, here logic 1, to subsequently disable the memory from transferring data to or from the DATA bus. At either the same time or a later time, the processor transitions $\overline{RAS}$ to an inactive logic 1 for at least a predetermined time before transitioning $\overline{RAS}$ to an active logic 0 to begin the next cycle.

Figure 1:
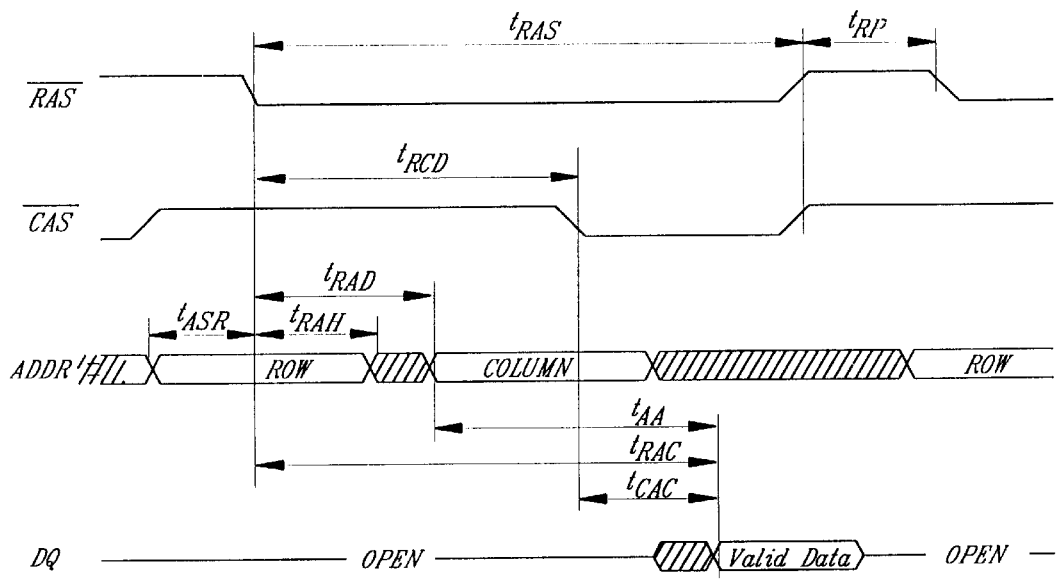
FIG. 1 is a timing diagram of a conventional read cycle.

It will be noted from a comparison of FIGS. 1 and 3 that the inventive approach causes the falling edge of $\overline{CAS}$, the presence of the column address on the ADDRESS bus, and the availability of data on the DATA bus to occur much sooner after the falling edge of $\overline{RAS}$. These reduced delay times are possible because the inventive approach of decoding the row address and checking for the need to use a redundant row during the precharge period has the effect of reducing $t_{RAC}$, $t_{RCD}$, $t_{RAD}$, and $t_{RAS}$, as explained above.

The conventional read mode cycle shown in FIG. 3 typically is used to read date from a single memory cell. However, it will be understood that the inventive approach of decoding the row address and checking for the need to use a redundant row during the precharge period is also applicable, with slight modifications that will be apparent to one skilled in the art, to other read modes, including the normal and EDO burst, nibble and page read modes.

Figure 4:
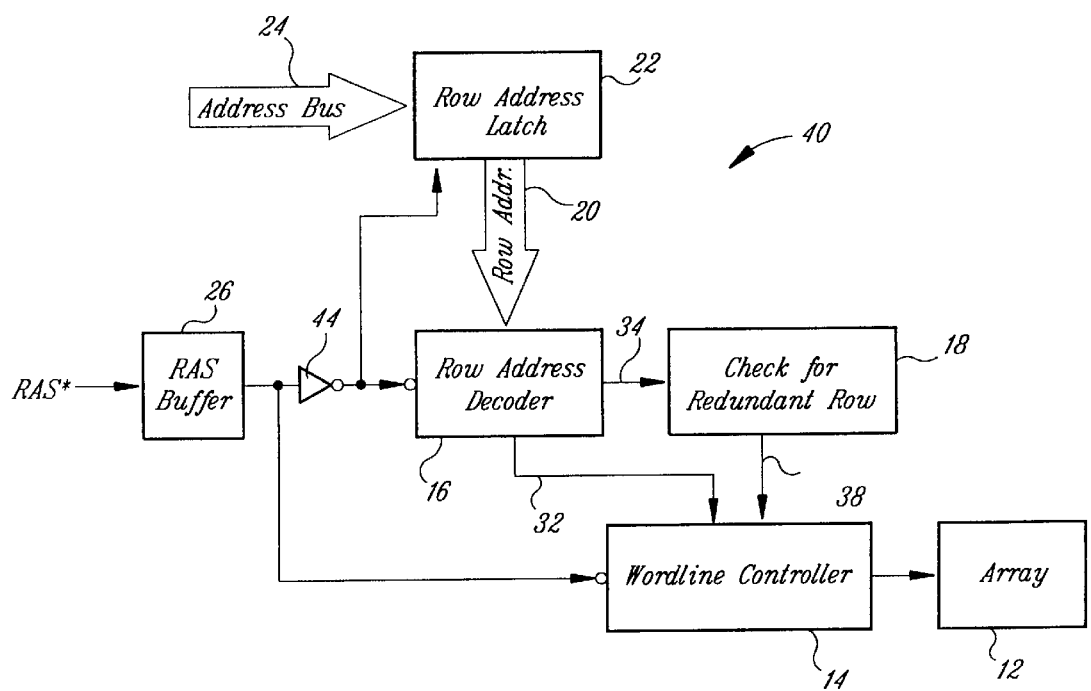
FIG. 4 is a block diagram of pertinent portions of a memory device according to the present invention.

A pertinent portion of a preferred embodiment of a memory device 40 that can fire a wordline controller without delaying by $t_{DEC}$ and $t_{RED}$ the transition of $\overline{RAS}$ is illustrated in FIG. 4. As with the prior art memory device of FIG. 2, the preferred embodiment of FIG. 4 shows only the portions of the row decoder devices that are pertinent to the invention. It will be understood by one skilled in the art that other components of the memory device 40, such as components for decoding and processing a column address and for routing data into and out of the memory device, have been omitted. The preferred embodiment of a memory device 40 of FIG. 4 utilizes much of the same components of the prior art memory device of FIG. 2. Accordingly, these identical components have been given the same reference numeral, and a separate explanation of their operation has been omitted for the purpose of brevity. In fact, one of the advantages of the invention is that it is able to fire the wordline controller 14 without the need for a $t_{DEC}$ plus $t_{RED}$ delay using basically the same topography as in prior art memory devices. The preferred embodiment of FIG. 4 differs from the prior art memory device of FIG. 3 primarily in that it couples $\overline{RAS}$ to the row address buffer 24 and the row address decoder 16 through an inverter 44. The inverter causes the row address latch 24, the row address decoder 16 and the redundant row checker 18 to perform their respective functions responsive to the transition of $\overline{RAS}$ from its low active state to its high inactive state. As a result, the row address is stored in the latch 24 and decoded by the row address decoder 16 during the precharge period when $\overline{RAS}$ is in its inactive high state, as explained above with reference to FIG. 3. It is possible for the row address latch 24, row address decoder 16, and redundant row checker 18 to perform their respective functions during this precharge period because substantially all of the row precharge functions occurring in the array 12 during the $t_{RP}$ time are not affected by the $\overline{RAS}$ transition until the wordline controller 14 fires the addressed row. Consequently, when $\overline{RAS}$ transitions from its inactive high state to its active low state, the row address decoder 16 has already decoded the addressed row and the redundant row checker 18 has selected a redundant row, if the address row has been found to be defective. The wordline controller 14 can thus almost immediately fire the addressed row responsive to the transition of $\overline{RAS}$ to its active state. The delay times $t_{DEC}$ and $t_{RED}$ are thereby eliminated from the delay between the transition of $\overline{RAS}$ to its active state and the firing of a wordline and the consequential availability of data on the data bus. The only required topographical change in the prior art memory device is the addition of a single inverter 44. Furthermore, the only modification to computer systems and other devices with which the memory device 40 is used is to make the row address available on the ADDRESS bus 24 before the low to high transition of $\overline{RAS}$ during the previous memory access cycle.

Figure 5:
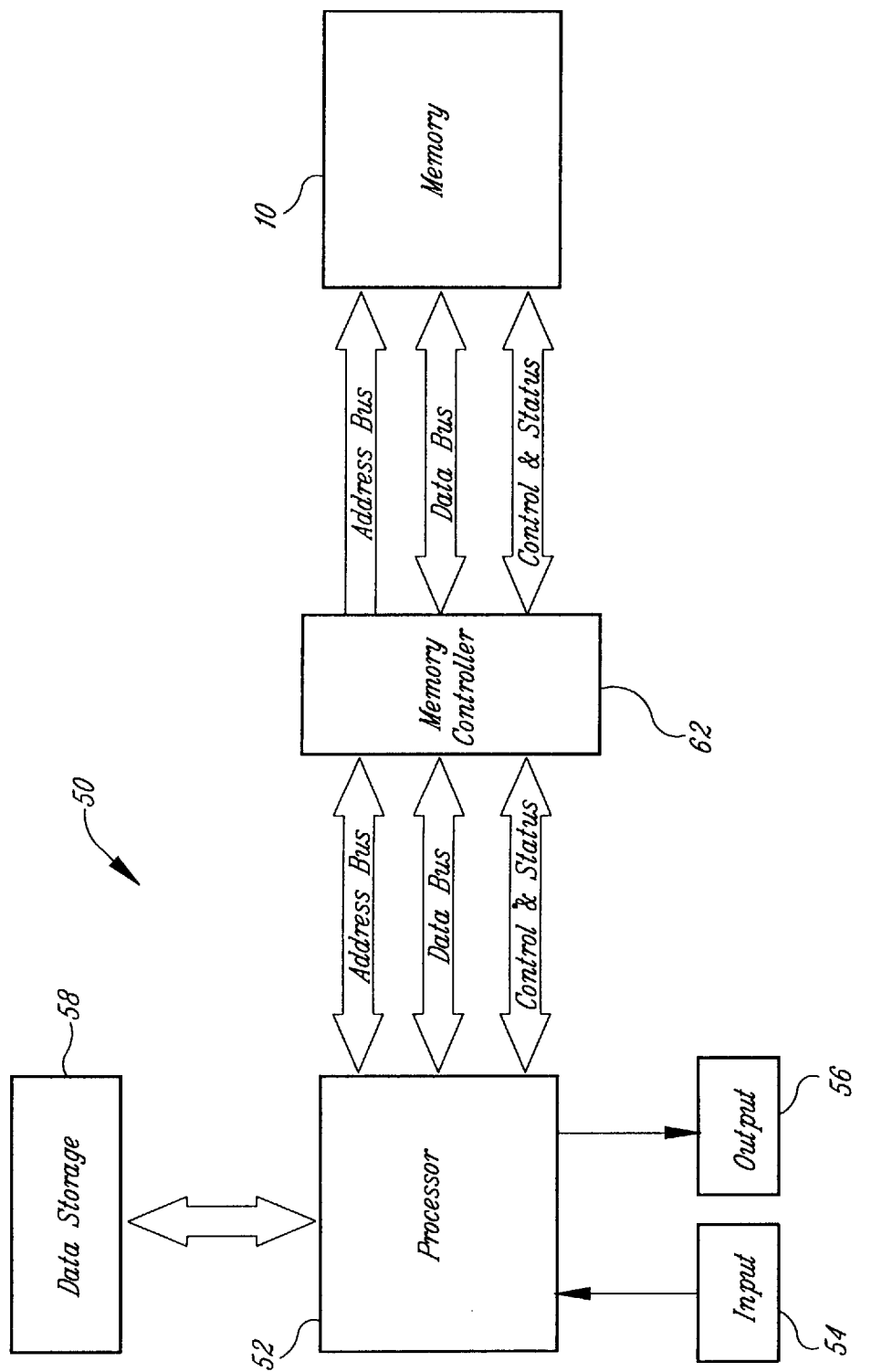
FIG. 5 is a block diagram of a computer system that incorporates the memory device of FIG. 4.

FIG. 5 is a block diagram of a computer system 50 that uses the memory device 10 of FIG. 4. The computer system 50 includes a processor 52 for performing computer functions, such as executing software to perform desired calculations and tasks. The processor 52 is connected to the memory device 10, as shown through a memory controller 62 that provides the appropriate signals for the memory 10. One or more input devices 54, such as a keypad or a mouse, are coupled to the processor 52 and allow an operator (not shown) to manually input data thereto. One or more output devices 56 are coupled to the processor 52 to provide to the operator data generated by the processor 52. Examples of output devices 56 include a printer and a video display unit. One or more data storage devices 58 are coupled to the processor 52 to store data on or retrieve data from external storage media (not shown). Examples of the storage devices 58 and corresponding storage media include drives that accept hard and floppy disks, tape cassettes, and compact disk read-only memories (CD-ROMs). Typically, the processor 52 generates the ADDRESS, $\overline{RAS}$, and $\overline{CAS}$ signals as well as other signals on control lines. The processor 52 is coupled to the ADDRESS and DATA buses and the control and status lines of the memory 10 as shown in FIG. 5.

It will be appreciated that, although specific embodiments of the invention have been described herein for purposes of illustration, various modifications may be made without departing from the spirit and scope of the invention. Accordingly, the invention is not limited except as by the appended claims.

I claim:

1. In a memory device adapted to receive a row address on an address bus and a row address strobe signal on a control input of the memory device, the memory device having at least one array of memory cells arranged in rows and columns, a method of processing the row address coupled to the address bus of the memory device, comprising:

in response to a transition of the row address strobe signal from a first logic level to a second logic level, decoding the row address; and in response to a transition of the row address strobe signal from the second logic level to the first logic level, activating a row of memory cells that may correspond to the decoded row address.

2. The method of claim 1 further comprising:

receiving a column address coupled to the address bus of the memory device;

receiving a column address strobe signal coupled to a second control input of the memory device;

in response to a transition of the column address strobe signal from a first logic level to a second logic level, decoding the column address; and coupling data between a data port of the memory device and a memory cell at the intersection of the row and column of memory cells corresponding to the row address and the column address, respectively.

3. The method of claim 1 further comprising:

in response to the transition of the row address strobe signal from the first logic level to the second logic level and after decoding the row address, checking for the need to substitute a row of memory cells for the row of memory cells corresponding to the row address; and in response to the transition of the row address strobe signal from the second logic level to the first logic level, activating a row of memory cells that needed to be substituted for a row of memory cells corresponding to the row address.

4. The method of claim 1 further comprising the step of latching the row address in the memory device responsive to the transition of the row address strobe signal from the first logic level to the second logic level.

5. The method of claim 1 wherein the memory device comprises a dynamic random access memory.

6. The method of claim 1 wherein the step of activating a row of memory cells comprises activating the row of memory cells that corresponds to the decoded row address.

7. In a memory device adapted to receive a row address on an address bus and a row address strobe signal on a control input of the memory device, the memory device having at least one array of memory cells arranged in rows and columns, a method of processing the row address coupled to the address bus of the memory device and decoded by the memory device, comprising:

in response to a transition of the row address strobe signal from a first logic level to a second logic level, checking for the need to substitute a row of memory cells for the row of memory cells corresponding to the row address; and in response to a transition of the row address strobe signal from the second logic level to the first logic level, activating a row of memory cells that needed to be substituted for a row of memory cells corresponding to the row address.

8. The method of claim 7 further comprising:

receiving a column address coupled to the address bus of the memory device;

receiving a column address strobe signal coupled to a second control input of the memory device;

in response to a transition of the column address strobe signal from a first logic level to a second logic level, decoding the column address; and coupling data between a data port of the memory device and a memory cell at the intersection of the row and column of memory cells corresponding to the row address and the column address, respectively.

9. The method of claim 7 wherein the memory device comprises a dynamic random access memory.

10. In a computer system having a processor and a memory device having a data bus, an address bus, and at least one control input, a method of operating the computer system comprising:

applying a row address to the address bus of the memory device, the row address being derived from an address generated by the processor;

applying to a control input of the memory device an externally generated control signal that transitions from a first logic level to a second logic level, the externally generated control signal derived from an externally generated control signal generated by the processor;

in response to the transition of the externally generated control signal from the first logic level to the second logic level, decoding the row address in the memory device;

applying to a control input of the memory device an externally generated control signal that transitions from the second logic level to the first logic level, the externally generated control signal derived from an externally generated control signal generated by the processor; and in response to the transition of the externally generated control signal from the second logic level to the first logic level, activating a row of memory cells that may correspond to the decoded row address.

11. The method of claim 10 further comprising:

applying a column address to the address bus of the memory device, the column address being derived from an address generated by the processor;

applying a third control signal to a control input of the memory device, the third control signal derived from a control signal generated by the processor;

in response to the third control signal, decoding the column address; and coupling data between the data bus of the memory device and a memory cell at the intersection of the row and column of memory cells corresponding to the row address and the column address, respectively.

12. The method of claim 10 further comprising:

in response to the transition of the externally generated control signal from the first logic level to the second logic level, and after decoding the row address, checking for the need to substitute a row of memory cells for the row of memory cells corresponding to the row address; and in response to the transition of the externally generated control signal from the second logic level to the first logic level, activating a row of memory cells that needed to be substituted for a row of memory cells corresponding to the row address.

13. The method of claim 10 further comprising the step of latching the row address in the memory device responsive to the transition of the externally generated control signal from the first logic level to the second logic level.

14. The method of claim 10 wherein the memory device comprises a dynamic random access memory.

15. The method of claim 10 wherein the step of activating a row of memory cells comprises activating the row of memory cells that corresponds to the decoded row address.

16. In a computer system having a processor and a memory device having a data bus, an address bus, and at least one control input, a method of operating the computer system comprising:

applying a row address to the address bus of the memory device, the row address being derived from an address generated by the processor;

applying to a control input of the memory device an externally generated control signal that transitions from a first logic level to a second logic level, the externally generated control signal derived from an externally generated control signal generated by the processor;

in response to the transition of the externally generated control signal from the first logic level to the second logic level, checking for the need to substitute a row of memory cells for the row of memory cells corresponding to the row address; and applying to a control input of the memory device an externally generated control signal that transitions from the second logic level to the first logic level, the externally generated control signal derived from an externally generated control signal generated by the processor; and in response to the transition of the externally generated control signal from the second logic level to the first logic level, activating the row of memory cells that needed to be substituted for a row of memory cells corresponding to the row address.

17. The method of claim 16 further comprising:

applying a column address to the address bus of the memory device, the column address being derived from an address generated by the processor;

applying a third control signal to a control input of the memory device, the third control signal derived from a control signal generated by the processor;

in response to the third control signal, decoding the column address; and coupling data between the data bus of the memory device and a memory cell at the intersection of the row and column of memory cells corresponding to the row address and the column address, respectively.

18. The method of claim 16 further comprising the step of latching the row address in the memory device responsive to the transition of the externally generated control signal from the first logic level to the second logic level.

19. The method of claim 16 wherein the memory device comprises a dynamic random access memory.

20. A memory device having an address bus, a data bus, and an address strobe input, the memory device comprising:

an array of memory cells arranged in rows and columns, the array of memory cells being coupled to the address bus and the data bus;

a row decoder coupled to the address bus and the address strobe input, the row decoder being adapted to decode a row address received on the address bus responsive to a transition of the row address strobe signal from a first value to a second value; and a wordline control circuit coupled to the row decoder and the array of memory cells, the wordline control circuit firing a row of the memory cells derived from a decoded row address responsive to a transition of the row address strobe signal from the second value to the first value.

21. The memory device of claim 20 further comprising a redundant row checker coupled to the row decoder, the redundant row checker adapted to determine if the row of memory cells corresponding to the decoded row address is defective and, if so, to cause the wordline control circuit to fire a redundant row of memory cells.

22. The memory device of claim 21 wherein the redundant row checker determines if the row of memory cells corresponding to the decoded row address is defective responsive to a transition of the row address strobe signal from a first value to a second value.

23. The memory device of claim 20 further comprising a row address latch positioned between the address bus and the address decoder, the row address latch storing a row address responsive to the transition of the row address strobe from the first level to the second level and applying the stored row address to the row decoder.

24. The memory device of claim 20 wherein the row of the memory cells fired by the wordline control circuit corresponds to the decoded row address.

25. A memory device having an address bus, a data bus, and an address strobe input, the memory device comprising:
- an array of memory cells arranged in rows and columns, the array of memory cells being coupled to the address bus and the data bus;
- a row decoder coupled to the address bus and the address strobe input, the row decoder being adapted to decode a row address received on the address bus;
- a redundant row checker coupled to the row decoder, the redundant row checker adapted to determine if the row of memory cells corresponding to the decoded row address is defective responsive to a transition of the row address strobe signal from a first value to a second value; and
- a wordline control circuit coupled to the row decoder, the redundant row checker and the array of memory cells, the wordline control circuit firing a row of the memory cells responsive to a transition of the row address strobe signal from the second value to the first value, the fired row corresponding to the decoded row address if the row of memory cells corresponding to the decoded row address is not defective, the fired row being a redundant row of memory cells if the row of memory cells corresponding to the decoded row address is defective.

26. The memory device of claim 25 further comprising a row address latch positioned between the address bus and the address decoder, the row address latch storing a row address responsive to the transition of the row address strobe from the first level to the second level and applying the stored row address to the row decoder.

27. A computer system, comprising:
- an input device;
- an output device;
- a processor coupled to the input device and the output device; and
- a memory device coupled to the processor, the memory device having an address bus, a data bus, and an address strobe input, the memory device comprising:
  - an array of memory cells arranged in rows and columns, the array of memory cells being coupled to the address bus and the data bus;
  - a row decoder coupled to the address bus and the address strobe input, the row decoder being adapted to decode a row address generated by the processor and received on the address bus responsive to a transition by of the row address strobe signal from a first value to a second value; and
  - a wordline control circuit coupled to the row decoder and the array of memory cells, the wordline control circuit firing a row of the memory cells that may correspond to a decoded row address responsive to a transition of the row address strobe signal from the second value to the first value.

28. The computer system of claim 27 further comprising a redundant row checker coupled to the row decoder, the redundant row checker adapted to determine if the row of memory cells corresponding to the decoded row address is defective and, if so, cause the wordline control circuit to fire a redundant row of memory cells.

29. The computer system of claim 28 wherein the redundant row checker determines if the row of memory cells corresponding to the decoded row address is defective responsive to a transition of the row address strobe signal from a first value to a second value.

30. The computer system of claim 27 further comprising a row address latch positioned between the address bus and the address decoder, the row address latch storing a row address responsive to the transition of the row address strobe from the first level to the second level and applying the stored row address to the row decoder.

31. The computer system of claim 27 wherein the row of the memory cells fired by the wordline control circuit corresponds to the decoded row address.

32. The computer system of claim 27 further comprising a memory controller coupling the processor to the memory device, the memory controller generating the row address strobe signal.

33. The computer system of claim 27 wherein the memory device is a dynamic random access memory.

34. A computer system, comprising:
- an input device;
- an output device;
- a processor coupled to the input device and the output device; and
- a memory device coupled to the processor, the memory device having an address bus, a data bus, and an address strobe input, the memory device comprising:
  - a row decoder coupled to the address bus and the address strobe input, the row decoder being adapted to decode a row address generated by the processor and received on the address bus;
  - a redundant row checker coupled to the row decoder, the redundant row checker adapted to determine if the row of memory cells corresponding to the decoded row address is defective responsive to a transition by of the row address strobe signal from a first value to a second value; and
  - a wordline control circuit coupled to the row decoder, the redundant row checker and the array of memory cells, the wordline control circuit firing a row of the memory cells responsive to a transition of the row address strobe signal from the second value to the first value, the fired row corresponding to the decoded row address if the row of memory cells corresponding to the decoded row address is not defective, the fired row being a redundant row of memory cells if the row of memory cells corresponding to the decoded row address is defective.

35. The computer system of claim 34 further comprising a row address latch positioned between the address bus and the address decoder, the row address latch storing a row address responsive to the transition of the row address strobe from the first value to the second value and applying the stored row address to the row decoder.

36. A computer system having a processor, a memory device having an address bus, a data bus and at least one control input, and a program storage device storing instructions, that, when executed by the processor, performs the steps of applying a row address to the address bus of the memory device;

applying to a control input of the memory device an externally generated control signal that transitions from a first logic level to a second logic level;

in response to the transition of the externally generated control signal from the first logic level to the second logic level, decoding the row address in the memory device;

applying to a control input of the memory device an externally generated control signal that transitions from the second logic level to the first logic level; and in response to the transition of the externally generated control signal from the second logic level to the first logic level, activating a row of memory cells that may correspond to the decoded row address.

37. The computer system of claim 36 wherein the program storage device further stores instructions, that, when executed by the processor, performs the steps of applying a column address to the address bus of the memory device;

applying a third control signal to a control input of the memory device;

in response to the third control signal, decoding the column address; and coupling data between the data bus of the memory device and a memory cell at the intersection of the row and column of memory cells corresponding to the row address and the column address, respectively.

38. The computer system of claim 36 wherein the program storage device further stores instructions, that, when executed by the processor, performs the steps of:

in response to the transition of the externally generated control signal from the first logic level to the second logic level, and after decoding the row address, checking for the need to substitute a row of memory cells for the row of memory cells corresponding to the row address; and in response to the transition of the externally generated control signal from the second logic level to the first logic level, activating a row of memory cells that needed to be substituted for a row of memory cells corresponding to the row address.

39. The computer system of claim 36 wherein the program storage device further stores instructions, that, when executed by the processor, performs the step of latching the row address in the memory device responsive to the transition of the externally generated control signal from the first logic level to the second logic level.

40. The computer system of claim 36 wherein the memory device comprises a dynamic random access memory.

41. The computer system of claim 36 further comprising a redundant row checker coupled to the row decoder, and wherein the program storage device further stores instructions, that, when executed by the processor, causes the redundant row checker to perform the steps of determining if the row of memory cells corresponding to the decoded row address is defective and, if so, causing the wordline control circuit to fire a redundant row of memory cells.

42. The computer system of claim 41 wherein the program storage device further stores instructions, that, when executed by the processor, performs the steps of causing the redundant row checker to determine if the row of memory cells corresponding to the decoded row address is defective responsive to the transition of the externally generated control signal from the first logic level to the second logic level.

43. The computer system of claim 36 further comprising a row address latch positioned between the address bus and the address decoder, and wherein the program storage device further stores instructions, that, when executed by the processor, performs the steps of causing the row address latch to store a row address responsive to the first control signal and to apply the stored row address to the row decoder.

44. The computer system of claim 36 wherein the row of the memory cells fired by the wordline control circuit corresponds to the decoded row address.

45. The computer system of claim 36 further comprising a memory controller coupling the processor and the memory device, the memory device selectively generating the control signals.

46. A computer system having a processor, a memory device having an address bus, a data bus and at least one control input, and a program storage device storing instructions, that, when executed by the processor, performs the steps of applying a row address to the address bus of the memory device;

applying to a control input of the memory device an externally generated control signal that transitions from a first logic level to a second logic level;

in response to the transition of the externally generated control signal from the first logic level to the second logic level, checking for the need to substitute a row of memory cells for the row of memory cells corresponding to the row address;

applying to a control input of the memory device an externally generated control signal that transitions from the second logic level to the first logic level; and in response to the transition of the externally generated control signal from the second logic level to the first logic level, activating the row of memory cells that needed to be substituted for a row of memory cells corresponding to the row address.

47. The computer system of claim 46 wherein the program storage device further stores instructions, that, when executed by the processor, performs the step of latching the row address in the memory device responsive to the transition of the externally generated control signal from the first logic level to the second logic level.

48. The computer system of claim 46 wherein the memory device comprises a dynamic random access memory.

49. The computer system of claim 46 wherein the program storage device further stores instructions, that, when executed by the processor, performs the steps of:

applying a column address to the address bus of the memory device;

applying a third control signal to a control input of the memory device;

in response to the third control signal, decoding the column address; and coupling data between the data bus of the memory device and a memory cell at the intersection of the row and column of memory cells corresponding to the row address and the column address, respectively.

* * * * *

UNITED STATES PATENT AND TRADEMARK OFFICE
CERTIFICATE OF CORRECTION

PATENT NO. : 5,845,315
DATED : December 1, 1998
INVENTOR(S) : Douglas J. Cutter

It is certified that error appears in the above-identified patent and that said Letters Patent is hereby corrected as shown below:

| [56] References Cited | Reads | Should Read |
|---|---|---|
| 5,065,062 | 11/1991 | 10/1991 |

| Column, Line | Reads | Should Read |
|---|---|---|
| Column 1, Line 21 | "Easter" | -- faster -- |
| Column 6, Line 20 | "RAS" | -- CAS -- |

Signed and Sealed this

Twenty-ninth Day of May, 2001

Attest:

NICHOLAS P. GODICI

*Attesting Officer*    *Acting Director of the United States Patent and Trademark Office*